United States Patent
Rührig et al.

(10) Patent No.: US 6,903,430 B2
(45) Date of Patent: Jun. 7, 2005

(54) DIGITAL MAGNETIC MEMORY CELL DEVICE

(75) Inventors: Manfred Rührig, Eckental (DE); Joachim Wecker, Röttenbach (DE)

(73) Assignee: Infineon Technologies AG, Munich (DE)

( * ) Notice: Subject to any disclaimer, the term of this patent is extended or adjusted under 35 U.S.C. 154(b) by 300 days.

(21) Appl. No.: 10/252,995

(22) Filed: Sep. 23, 2002

(65) Prior Publication Data

US 2003/0063492 A1 Apr. 3, 2003

(30) Foreign Application Priority Data

Sep. 21, 2001 (DE) .......................... 101 46 546

(51) Int. Cl.[7] .............................................. H01L 43/00
(52) U.S. Cl. ...................... 257/421; 257/414; 257/422; 257/427
(58) Field of Search ................................ 257/925, 108, 257/414, 421, 422, 427

(56) References Cited

U.S. PATENT DOCUMENTS

| | | | |
|---|---|---|---|
| 5,432,734 A | | 7/1995 | Kawano et al. |
| 5,874,886 A | | 2/1999 | Araki et al. |
| 6,269,018 B1 | * | 7/2001 | Monsma et al. ............ 365/145 |
| 6,365,286 B1 | * | 4/2002 | Inomata et al. ............ 428/692 |

FOREIGN PATENT DOCUMENTS

| | | |
|---|---|---|
| EP | 0 791 915 A2 | 8/1997 |
| JP | 2000 243 627 A | 9/2000 |

OTHER PUBLICATIONS

Mutsuko Jimbo et al.: "Giant Magnetoresistance Effect in Amorphous CoFoB Sandwiches", *Jpn. J. Appl. Phys.*, vol. 34, 1995, pp. L112–L114.

H. Sakakima et al.: "Magnetoresistance in CoMnB/Co(Fe)/Cu/Co(Fe) spin valves", *Journal of Magnetism and Magnetic Materials*, vol. 165, 1997, pp. 108–110.

S. Tsunashima et al.: "Spin valves using amorphous magnetic layers", *Journal of Magnetism and Magnetic Materials*, vol. 165, 1997, pp. 111–115.

* cited by examiner

Primary Examiner—Richard Elms
Assistant Examiner—Douglas Menz
(74) Attorney, Agent, or Firm—Laurence A. Greenberg; Werner H. Stemer; Ralph E. Locher

(57) ABSTRACT

A digital magnetic memory cell device for read and/or write operations has a soft-magnetic read and/or write layer system formed of at least one soft-magnetic read and/or write layer, and a hard-magnetic reference layer system. The two systems are separated by a barrier layer. The soft-magnetic read and/or write layer is an amorphous layer with an induced or inducible uniaxial anisotropy.

24 Claims, 1 Drawing Sheet

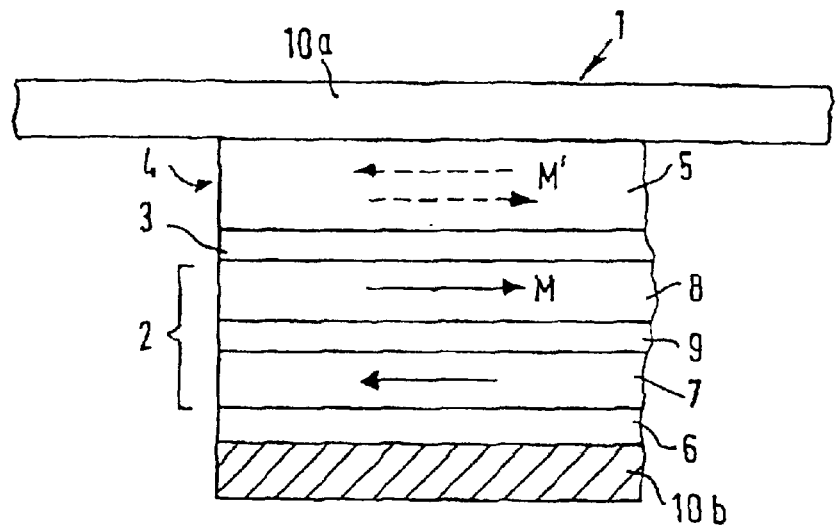
FIG. 1
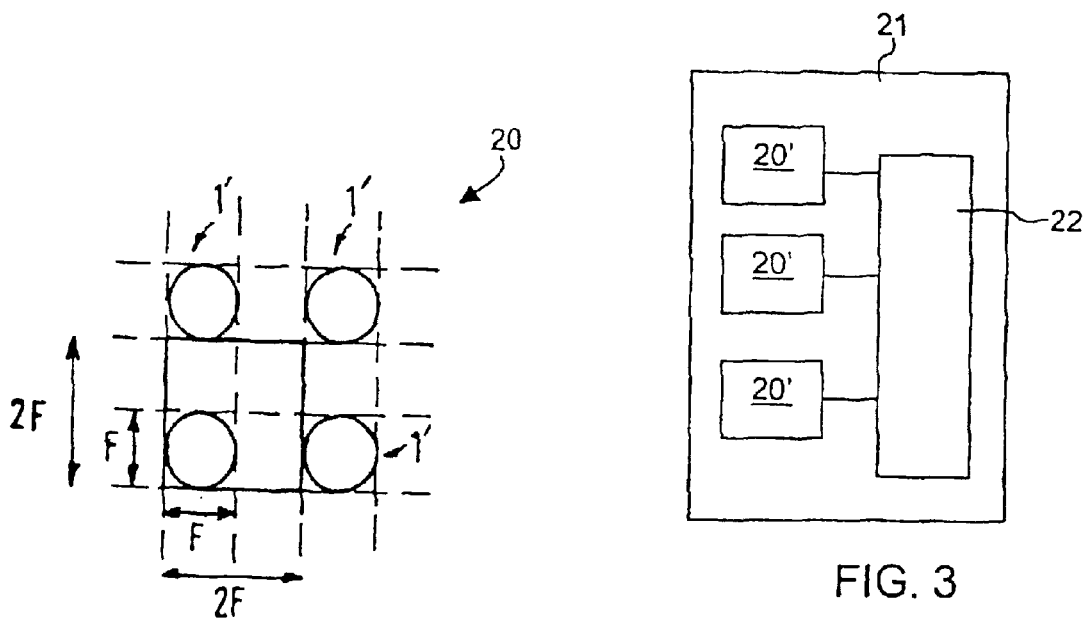
FIG. 2
FIG. 3

DIGITAL MAGNETIC MEMORY CELL DEVICE

BACKGROUND OF THE INVENTION

Field of the Invention

The invention relates to a digital magnetic memory cell device for read and/or write operations, having a soft-magnetic read and/or write layer system comprising at least one soft-magnetic read and/or write layer, and a hard-magnetic reference layer system. The two systems are separated from one another by a barrier layer.

A digital memory cell device of this type serves for storing information on a magnetic basis. An individual memory cell device is generally part of a memory device, often also called MRAM (magnetic random access memory). A memory of this type can be used to carry out read and/or write operations. Each individual memory cell device comprises a soft-magnetic read and/or write layer system, which is separated by means of an intermediate layer from a hard-magnetic reference layer system, formed for example as an AAF system. The magnetization of the reference layer of the reference layer system is stable and does not change in an applied field, while the magnetization of the soft-magnetic read and/or write layer system can be switched by means of an applied field. The two magnetic layer systems can be magnetized parallel or antiparallel with respect to one another. The two aforementioned states in each case represent a bit of information, i.e. the logic zero ("0") state or one ("1") state. If the relative orientation of the magnetization of the two layers changes from parallel to antiparallel, or vice versa, then the magnetoresistance changes over this layer structure by a few percent. This change in resistance can be used for the read-out of digital information stored in the memory cell. The change in the cell resistance can be identified by a voltage change. By way of example, the cell may be occupied by a logic zero ("0") in the event of a voltage increase and the cell may be occupied by a logic one ("1") in the event of a voltage decrease. Particularly large resistance changes in the region of a few percent have been observed when the magnetization orientation changes from parallel to antiparallel and vice versa in cell structures of the GMR type (giant magnetoresistance) or the TMR type (tunnel magnetoresistance).

An important advantage of such magnetic memory cells is that the information is stored in a persistent manner in this way, and is stored without maintenance of any basic supply even with the device switched off and is immediately available again after the device is switched on, unlike in known conventional semiconductor memories.

The central element is a soft-magnetic read and/or write layer system having a soft-magnetic read and/or write layer, the magnetization of which can be turned by means of an external field.

In the memory cell device wherein the magnetization of the soft-magnetic read and/or write layer is to be switched between two defined directions, a uniaxial anisotropy is required within the soft-magnetic read and/or write layer, by means of which anisotropy an easy magnetic axis is defined, wherein the magnetization is turned particularly easily. In known layer elements, NiFe (permalloy) is customarily used as soft-magnetic layer material. The uniaxial anisotropy which is required is introduced into the permalloy layer by means of the geometry of the read and/or write layer or of the entire layer element, the geometry of which ultimately follows that of the read and/or write layer. This geometry-related anisotropy is known as shape anisotropy. Typical aspect ratios, i.e. the ratio of the length to the width of the layer, are 2 to 3, and a typical length of a substantially elliptical layer of this type is, for example, approximately 300 nm. However, a drawback of layers of this type is that as the shape anisotropy decreases, i.e. the aspect ratio decreases, the switching characteristics are influenced to an ever greater extent by deviations in the actual shape of the layer from the ideal geometry. These deviations may on the one hand be production-related, for example caused by inaccuracies in the lithography, or may be caused by the crystallite structure of the permalloy layer, to which in particular edgeside deformation is attributable. Higher aspect ratios in turn lead to greater effective cell areas, which is to the detriment of increasing the level of integration.

SUMMARY OF THE INVENTION

It is accordingly an object of the invention to provide a digital magnetic memory cell device, which overcomes the above-mentioned disadvantages of the heretofore-known devices and methods of this general type and provides a digital magnetic memory cell device which has a reduced tendency to anisotropy fluctuations caused by geometry.

With the foregoing and other objects in view there is provided, in accordance with the invention, a digital magnetic memory cell device for read and/or write operations, comprising:

a soft-magnetic layer system with at least one soft-magnetic read and/or write layer, the soft-magnetic layer being an amorphous layer with induced or inducible uniaxial anisotropy.

a hard-magnetic reference layer system; and a barrier layer separating the soft-magnetic layer system from the hard-magnetic reference layer system.

In other words, the objects of the invention are achieved in that a memory cell device of the type described in the introduction has a soft-magnetic read and/or write layer formed as an amorphous layer with an induced or inducible uniaxial anisotropy.

The invention proposes using an amorphous layer, which either already has a uniaxial anisotropy which has been induced during its production or wherein a uniaxial anisotropy can be induced after it has been produced, instead of the crystalline permalloy layer which has been used hitherto in a magnetoresistive memory cell device. Instead of the shape anisotropy alone, as used primarily in known layer elements with a permalloy layer, an induced or inducible uniaxial anisotropy is used, the order of magnitude of which is readily comparable to the shape anisotropy. As a result, the geometry-related drawbacks relating to the shape anisotropy are reduced or can readily be compensated for by the induced anisotropy, provided that the read and/or write layer has a certain level of shape anisotropy.

A further advantage of the use of an amorphous layer over the crystalline permalloy layer is that, on account of the absence of grain boundaries, there is a significantly lower edge roughness at the layer edges. This is advantageous for an improved switching performance and/or an improved turning of the magnetization. A further advantage which should be cited in this context is that, in small cells, the influence of the finite grain size—as is the case with permalloy layers—on the switching performance or the turning of the magnetization is eliminated. In known permalloy layers, there is a considerable scatter in the switching or turning performance over the wafer on which the cells are produced as a function of the local arrangement of the permalloy grains, their number and their orientation, since these fluctuations within the local arrangement of the grains in permalloy layers leads to locally different switching or hysteresis curves, which deviate significantly from the ideal switching curve, resulting in a locally different switching performance. Since the amorphous layer does not have any individual grains or grain structure, these difficulties also do not have to be dealt with in the memory cell device according to the invention.

The anisotropy can be induced by producing the amorphous layer in an applied magnetic field, in particular by sputtering in the magnetic field. Alternatively, it is possible to induce the anisotropy by conditioning under an applied magnetic field at a temperature of $\leq 600°$ C., in particular $\leq 400°$ C., preferably $\leq 300°$ C., i.e. it is possible to establish the anisotropy at any desired time after the production of the amorphous read and/or write layer or to change an anisotropy which has already been induced, for example by magnetic-field sputtering, both in terms of its direction and in terms of its magnitude. In this context, it is particularly expedient if the temperature characteristics of the material which forms the amorphous layer are selected in such a way that conditioning at relatively low temperature is possible, so that any temperature-related drawbacks for the memory element as a whole are avoided as a result of this additional inducing step. In a preferred embodiment, the material of the amorphous layer is chosen such that it has a crystallization temperature of more than 300° C., and preferably above 350° C.

Compared to permalloy, which can only be conditioned at temperatures of >500° C., with the amorphous layer which is used in accordance with the invention conditioning should be possible even at temperatures of $\leq 400°$ C., but most expediently at temperatures of $\leq 300°$ C., without damaging effects on the cell stack. The field strength $H_A$ of the anisotropy which is induced in the amorphous layer is considerably greater than an anisotropy field strength $H_A$ which can be achieved with a permalloy layer and can be induced even at relatively low temperatures. While in permalloy the anisotropy field strength $H_A$ is approx. 0.5 kA/m, in the amorphous layer it is possible to produce anisotropy field strengths $H_A$ of $\geq 2$ kA/m, in particular $\geq 4$ kA/m.

According to a particularly expedient configuration of the invention, the soft-magnetic read and/or write layer—in plan view—is substantially circular. Since the invention proposes providing exclusively or at least primarily an induced anisotropy instead of the shape anisotropy, when using the amorphous layer it is possible for the layer to be produced in a circular shape. With circular cells of this type, the shape anisotropy has a sudden jump or disappears, i.e. in this case the uniaxial anisotropy is produced only by the induced anisotropy. As a result, it is particularly advantageously possible to produce what are known as $4F^2$ cells, which require a very small cell area. This means that the level of integration can be increased and optimized further, which is highly expedient with regard to the ever decreasing size of memories with a multiplicity of memory cell devices according to the invention. The diameter of the soft-magnetic read and/or write layer should be $\leq 1$ µm, in particular $\leq 300$ nm, preferably $\leq 150$ nm. The soft-magnetic read and/or write layer should have a thickness of $\leq 15$ nm, preferably $\leq 10$ nm, primarily of approx. 6 nm.

Furthermore, it is expedient if the soft-magnetic read and/or write layer has a shape anisotropy, the induced anisotropy supporting the shape anisotropy. Therefore, according to this configuration of the invention, the amorphous layer is produced in a geometric shape which is such that a shape anisotropy is established, although if necessary, given sufficient approximation to a circle shape, this shape anisotropy may be relatively minor. In any event, the induced anisotropy is established in such a manner that it supports the shape anisotropy, so that in this way the fluctuation in the shape anisotropy caused by any geometric irregularities which may also occur in an amorphous layer on account of the lithography etc. can be reduced and/or as far as possible compensated for. As a result, the switching performance can be controlled more successfully. An amorphous read and/or write layer which has a shape anisotropy should have a length width aspect ratio of $\leq 6$, in particular $\leq 4$, preferably $\leq 2$.

The amorphous layer should be an optionally oxidic alloy comprising at least one ferromagnetic material with at least one glass-forming agent and/or at least one metal. Examples of suitable ferromagnetic materials are Co, Ni or Fe, and examples of glass-forming agents which can be used are Si, B or P. By way of example, Zr, Nb or Mo can be used as metallic alloying constituent. An example of an expedient alloy for forming the amorphous layer is a CoFeNiSiB alloy, primarily with a composition of $Co_{64}Fe_5Ni_5Si_{13}B_{13}$. Since alloys for amorphous soft-magnetic layers are generally multicomponent alloy systems wherein the resistivity is significantly higher than in known permalloy layers (typically by a factor of 2–3), there is an improvement in the dynamic switching performance compared to known permalloy layers, since on account of the higher resistivity, which should be as high as possible, the result is very low electrical switching losses on account of induced eddy currents, especially in the case of high-frequency switching of the magnetization.

Furthermore, it is expedient if a further soft-magnetic layer, for example consisting of CoFe, is provided between the barrier layer and the read and/or write layer, which further soft-magnetic layer is preferably only a few atom layers thick, couples magnetically to the amorphous read and/or write layer and leads to an improved thermal stability on the part of the read and/or write layer.

With the above and other objects in view there is also provided, in accordance with the invention, a digital memory device that is formed with a plurality of memory cell devices each as described in the forgoing.

Other features which are considered as characteristic for the invention are set forth in the appended claims.

Although the invention is illustrated and described herein as embodied in a digital magnetic memory cell device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic outline sketch of a magnetoresistive memory cell device according to the invention;

FIG. 2 is a diagrammatic plan view of a configuration of a plurality of memory cell devices as $4F^2$ cells for forming a memory device; and FIG. 3 is a schematic block diagram of a digital memory device according to the invention.

DESCRIPTION OF THE PREFERRED EMBODIMENTS

Referring now to the figures of the drawing in detail and first, particularly, to FIG. 1 thereof, there is shown a magnetoresistive memory cell device 1 according to the invention, for example in the form of a TMR cell. The memory cell device comprises a hard-magnetic reference layer system 2, which is decoupled from a soft-magnetic read and/or write layer system 4 by a decoupling or barrier layer 3, which in the case of a TMR cell is a tunnel layer. In the exemplary embodiment shown, the read and/or write layer system 4 comprises a soft-magnetic read and/or write layer 5, it being possible for the latter to be covered on the top side by a further covering layer (not shown), for example consisting of Ta. A soft-magnetic layer (e.g. CoFe), which is only a few atom layers thick, is not shown and ensures high thermal stability of the read and/or write layer, may be arranged between the read and/or write layer 5 and the barrier layer 3. Furthermore, the figure shows the word and bit lines 10a, 10b which run at right angles to one another above and below the layer stack.

The reference layer system 2 itself is arranged on a substrate 6 (if appropriate above intervening seed layers, which are not shown). It comprises, for example, an AAF layer assembly, comprising a lower ferromagnetic layer 7 (e.g. Co), an upper ferromagnetic layer 8 (e.g. Co) and a coupling layer 9 (e.g. Cu) which is arranged between these two layers and is responsible for antiparallel coupling of the magnetizations. The structure of an AAF layer assembly of this type is sufficiently well known. The magnetization M of the upper ferromagnetic layer represents the hard-magnetic reference layer or bias layer magnetization, which is insensitive to external fields and with respect to which the magnetization M' of the soft-magnetic read and/or write layer 5 can be turned or switched if a sufficiently high external field is applied.

The soft-magnetic read and/or write layer 5 is an amorphous layer with an induced uniaxial anisotropy which runs in the plane of the drawing, the illustrated magnetization M' of the read and/or write layer 5 being shown as lying in both possible anisotropy or axial directions. The amorphous read and/or write layer 5 consists of a soft-magnetic alloy, for which in particular a CoFeNiSiB alloy is used. The uniaxial anisotropy can be induced either by producing the read and/or write layer 5 by sputtering in the applied magnetic field and/or by subsequent conditioning after production of the layer element as a whole in an applied magnetic field. The temperature properties of the alloy layer material used should be such that the conditioning used to induce the anisotropy can take place at temperatures which are as low as possible, primarily in the range of $\leq 300°$ C., in order to avoid adverse effects on layers of the layer stack caused by the conditioning step.

FIG. 2 shows an outline sketch of the arrangement of a plurality of memory cell devices according to the invention next to one another for forming a digital magnetic memory device. The figure shows four memory cell devices 1', which are illustrated in plan view, the amorphous read and/or write layer 5, which in the example shown is substantially circular, being visible in this case. This circular design is possible since the amorphous layer which is used according to the invention is distinguished by an induced uniaxial anisotropy, i.e. the geometry can be selected as desired if a shape anisotropy does not have to be produced, unlike in known permalloy layers. Each memory cell device has a "width" F and a "length" F. The distance between two memory cell devices 1' is likewise F. The result of this is that the overall area required for a memory cell device 1', including the distance from an adjacent memory cell, is $2F \times 2F = 4F^2$. This total area is illustrated in FIG. 2. This means that, on account of the use of the amorphous layer and the possibility of forming substantially circular read and/or write layers—and therefore, of course, also circular layer stacks or layer elements—the level of integration can be increased considerably, since a memory cell device requires a smaller area on the wafer than is the case with known memory cell devices with permalloy layers which, on account of the shape anisotropy which is to be produced, are substantially elliptical in shape and are therefore significantly wider than the circular cells.

With reference to FIG. 3, there is shown a highly schematic illustration of a digital memory device 21. A plurality of memory cell devices 20' (three are illustrated for reasons of simplicity and clarity) according to the above description are connected to a common controller 22.

We claim:

1. A digital magnetic memory cell device, comprising:
    a soft-magnetic layer system with at least one soft-magnetic layer, said soft-magnetic layer being an amorphous layer with uniaxial anisotropy having a shape anisotropy based on an aspect ratio of length to width of said soft-magnetic layer, and the uniaxial anisotropy being an induced anisotropy supporting the shaped anisotropy;
    a hard-magnetic reference layer system; and
    a barrier layer separating said soft-magnetic layer system from said hard-magnetic reference layer system.

2. The memory cell device according to claim 1, wherein said soft-magnetic layer system is a read/write layer system adapted for read/write operations.

3. The memory cell device according to claim 1, wherein said amorphous layer is formed such that the anisotropy is induced by conditioning under an applied magnetic field at a temperature of $\leq 600°$ C.

4. The memory cell device according to claim 3, wherein said anisotropy is induced at a temperature of $\leq 400°$ C.

5. The memory cell device according to claim 3, wherein said anisotropy is induced at a temperature of $\leq 300°$ C.

6. The memory cell device according to claim 1, wherein said anisotropy is induced by producing said amorphous layer in an applied magnetic field.

7. The memory cell device according to claim 1, wherein said amorphous layer is a sputter layer formed in an applied magnetic field.

8. The memory cell device according to claim 1, wherein said soft-magnetic layer has a thickness of $\leq 15$ nm.

9. The memory cell device according to claim 1, wherein said soft-magnetic layer has a thickness of $\leq 10$ nm.

10. The memory cell device according to claim 1, wherein said soft-magnetic layer has a thickness of $\leq 6$ nm.

11. The memory cell device according to claim 1, wherein the soft-magnetic layer with said shape anisotropy has an aspect ratio of $\leq 6$.

12. The memory cell device according to claim 1, wherein the soft-magnetic layer with said shape anisotropy has an aspect ratio of $\leq 4$.

13. The memory cell device according to claim 1, wherein the soft-magnetic layer with said shape anisotropy has an aspect ratio of $\leq 2$.

14. The memory cell device according to claim 1, wherein said amorphous layer is an alloy comprising at least one ferromagnetic material with a material selected from the group consisting of at least one glass-forming agent and at least one metal.

15. The memory cell device according to claim 14, wherein said amorphous layer is an oxidic alloy.

16. The memory cell device according to claim 14, wherein said amorphous layer is a COFeNiSiB alloy layer.

17. The memory cell device according to claim 1, wherein the anisotropy is an induced anisotropy with a field strength $H_A$ of $\geq 2$ kA/m.

18. The memory cell device according to claim 1, wherein the anisotropy is an induced anisotropy with a field strength $H_A$ of $\geq 4$ kA/m.

19. The memory cell device according to claim 1, which comprises at least one further layer adjacent said soft-magnetic layer and magnetically coupling to said soft-magnetic layer.

20. The memory cell device according to claim 19, wherein said further layer is disposed between said amorphous layer and said barrier layer, and wherein said further layer has a thickness of a few atom layers.

21. The memory cell device according to claim 20, wherein said thickness of said further layer is less than 2 nm.

22. The memory cell device according to claim 1, wherein a material of said amorphous layer has a crystallization temperature of more than 300° C.

23. The memory cell device according to claim 1, wherein a material of said amorphous layer has a crystallization temperature of more than 350° C.

24. A digital memory device, comprising a plurality of memory cell devices each according to claim 1.

* * * * *